(12) United States Patent
Slawecki

(10) Patent No.: US 7,102,407 B2
(45) Date of Patent: Sep. 5, 2006

(54) PROGRAMMABLE CLOCK DELAY CIRCUIT

(75) Inventor: Darren Slawecki, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 10/815,015

(22) Filed: Mar. 31, 2004

(65) Prior Publication Data

US 2005/0218953 A1    Oct. 6, 2005

(51) Int. Cl.
    *H03H 11/26*      (2006.01)
(52) U.S. Cl. .................. 327/263; 327/276; 327/285
(58) Field of Classification Search ................ 327/276, 327/278, 285, 170, 261, 263, 264
See application file for complete search history.

(56) References Cited

U.S. PATENT DOCUMENTS

| | | | | |
|---|---|---|---|---|
| 5,097,159 A | * | 3/1992 | Seki et al. ................. 327/263 |
| 5,121,014 A | * | 6/1992 | Huang ....................... 327/276 |
| 5,506,534 A | * | 4/1996 | Guo et al. .................. 327/276 |
| 5,852,640 A | * | 12/1998 | Kliza et al. ................ 375/356 |
| 6,052,811 A | | 4/2000 | Ahsuri ....................... 714/745 |
| 6,304,124 B1 | * | 10/2001 | Mizuno ..................... 327/281 |
| 6,388,489 B1 | * | 5/2002 | Fetzer et al. ............... 327/210 |
| 6,389,091 B1 | * | 5/2002 | Yamaguchi et al. ....... 375/376 |
| 6,404,258 B1 | * | 6/2002 | Ooishi ........................ 327/278 |
| 6,411,150 B1 | * | 6/2002 | Williams .................... 327/281 |
| 6,424,197 B1 | * | 7/2002 | Salcedo et al. ............ 327/276 |
| 6,462,597 B1 | * | 10/2002 | Lee ............................ 327/261 |
| 6,573,777 B1 | * | 6/2003 | Saint-Laurent et al. .... 327/276 |
| 6,859,082 B1 | * | 2/2005 | Tang .......................... 327/276 |
| 6,928,572 B1 | * | 8/2005 | Fletcher et al. ............ 713/401 |

* cited by examiner

*Primary Examiner*—Terry D. Cunningham
*Assistant Examiner*—Hai L. Nguyen
(74) *Attorney, Agent, or Firm*—Blakely, Sokoloff, Taylor & Zafman LLP

(57) ABSTRACT

A delay circuit. The delay circuit includes a first circuit, a falling edge delay circuit and a rising edge delay circuit. The first circuit includes a circuit input for receiving a reference signal and a circuit output for outputting a delayed signal. The falling edge delay circuit is coupled to the first circuit to control delay of a falling edge of the reference signal. The rising edge delay circuit is coupled to the first circuit to control delay of a rising edge of the reference signal.

37 Claims, 6 Drawing Sheets

US 7,102,407 B2

PROGRAMMABLE CLOCK DELAY CIRCUIT

TECHNICAL FIELD

This disclosure relates generally to delay circuits, and in particular but not exclusively, relates to a programmable clock delay circuits.

BACKGROUND INFORMATION

Within most integrated circuits ("ICs") there is usually one data path that requires more time to propagate valid data than all other data paths. The data path that requires the longest propagation time before it may be sampled or is resolved is known as the critical path of the IC. A circuit path may be slow due, for example, to a greater number of device delays within the critical path or a greater signal travel distance.

The maximum speed at which the IC may operate is limited by the critical path of the IC. The reason for this is that the critical path presents the longest delay path and the clock rate cannot be increased beyond the point at which the clock cycle time is equal to the propagation delay of signals traveling along the critical path.

Since the maximum clock speed of an IC is limited by its critical path, locating the critical path (LCP) is an important design task. Once the critical path has been identified, the design may be optimized to reduce the time it takes a signal to propagate along the critical path. LCP and design optimizations may be repetitive tasks. Each time the design is optimized to reduce the delay length of a critical path, a new critical path may arise. Large scale IC design is complicated by the millions of possible critical paths. LCP becomes the task of locating the proverbial needle in a haystack. As such, sophisticated design and testing tools are required.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments of a system and apparatus for implementing a programmable delay circuit are described herein. In the following description numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. Use of the phrases "logic low" or "logic 0" may be used interchangeably to represent one logic state of binary logic while a "logic high" or "logic 1" may represent the other state. Further, the logic described herein may include a third logic state known as a "high impedance state".

Figure 1:
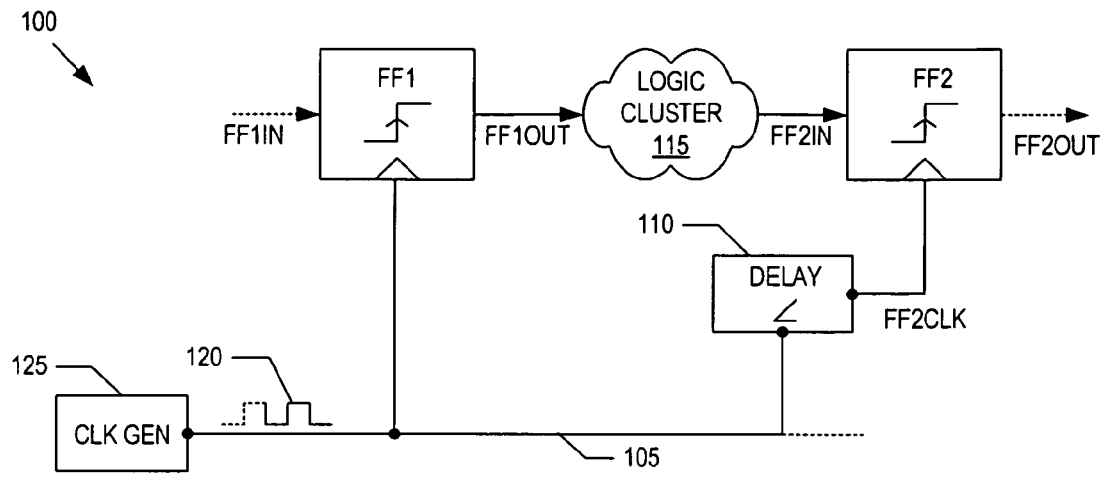
FIG. 1 is a block diagram illustrating a clock distribution network for distributing a reference clock signal to a logic cluster.

FIG. 1 is a block diagram illustrating a synchronous circuit 100 including clock delay circuits for timing a logic cluster, in accordance with an embodiment of the present invention. Synchronous circuit 100 includes a clock distribution network 105, a delay circuit 110, flip-flops FF1 and FF2, and logic cluster 115.

Clock distribution network 105 delivers a reference clock signal 120 to flip-flop FF1 and delay circuit 110. Clock distribution network 105 may include a number of branching signal paths that are routed throughout synchronous circuit 100. Clock distribution network 105 may include a number of repeaters (not illustrated) to restore reference clock signal 120 and maintain an acceptable slope and skew throughout and delay buffers (not illustrated) to match clock propagation delays to each of flip-flops FF1 and FF2. A clock generator 125 generates reference clock signal 120. Clock generator 125 typically is external to synchronous circuit 100 and may include a crystal resonator, such as quartz, or other known clock generating circuits. Logic cluster 115 may include combination logic and/or sequential logic having finite delays.

In the illustrated embodiment, flip-flop FF1 is directly clocked by reference clock 120. Delay circuit 110 is configured to receive reference clock signal 120 and output a delayed clock signal FF2CLK to clock flip-flop FF2. In synchronous designs, such as synchronous circuit 100, events occur on clock edges, either the rising edge or the falling edge. Flip-flops FF1 and FF2 are illustrated as rising edge flip-flops, though falling edge flip-flops may also be implemented. Flip-flops FF1 and FF2 hold their outputs FF1OUT and FF2OUT between rising edges of their clock signals. Upon each rising edge of reference clock signal 120, flip-flop FF1 latches its input FF1IN to its output FF1OUT and holds FF1OUT until at least the next rising edge of reference clock signal 120. Similarly, flip-flop FF2 latches its input FF2IN to its output FF2OUT in response to each rising edge of FF2CLK. Thus, FF1OUT must propagate through logic cluster 115 and resolve as FF2IN within one period of reference clock signal 120 in order to latch to FF2OUT in a timely manner.

Figure 2:
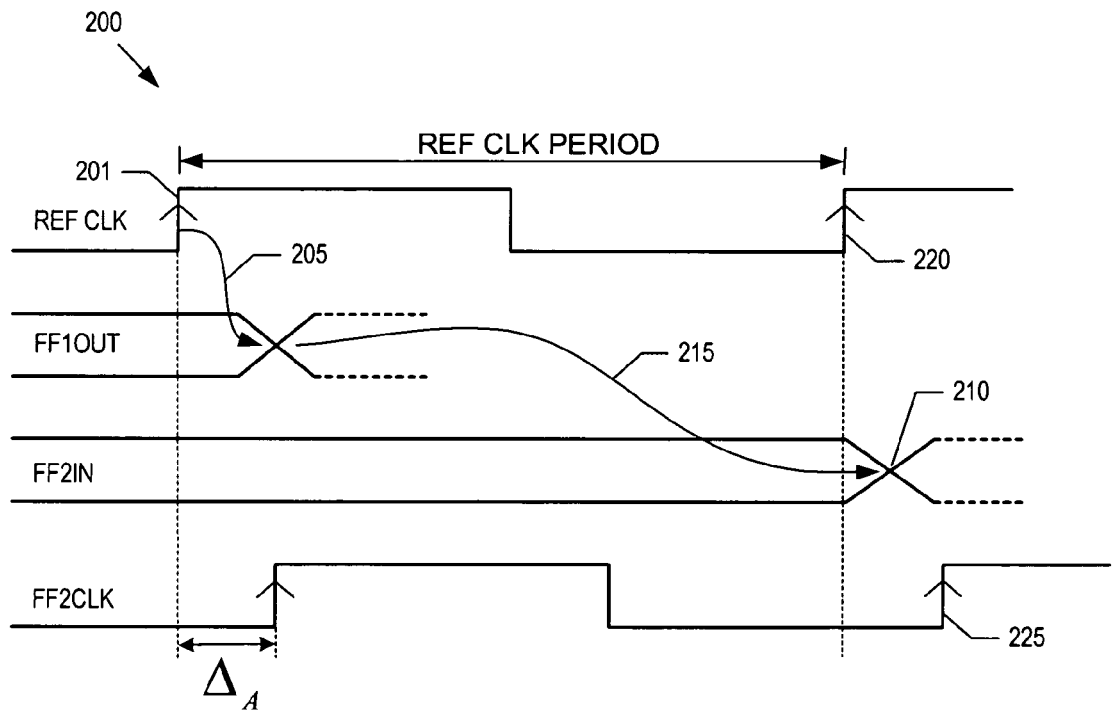
FIG. 2 is a timing diagram illustrating how delaying a reference clock signal along a critical path of an integrated circuit can be used to increase the reference clock speed.

FIG. 2 illustrates a timing diagram 200 of the signals illustrated in FIG. 1. FIG. 2 illustrates how delay circuit 110 introduces a delay $\Delta_A$ into FF2CLK for timing flip-flop FF2. When reference clock signal 120 rises at 201, flip-flop FF1 latches input FF1IN through to output FF1OUT after a propagation delay inherent to flip-flop FF1, as illustrated by arrow 205. Subsequently, a change in FF1OUT is propagated through logic cluster 115 and resolves at 210 as input FF2IN to flipflop FF2, as illustrated by arrow 215. As can be seen, FF2IN does not resolve until after the next rising edge 220 of reference clock signal 120. Without delay circuit 110 delaying reference clock signal 120 by delay $\Delta_A$, flip-flop FF2 would latch a stale value of FF2IN through to FF2OUT. However, because delay circuit 110 outputs FF2CLK with delay $\Delta_A$ relative to reference clock signal 120, FF2IN is resolved prior to rising edge 225 of FF2CLK. Therefore, the current value of FF2IN is latched through to FF2OUT.

If logic cluster 115 represents the critical path of synchronous circuit 100, then the propagation delay from FF1OUT to FF2IN (plus the clock to out delay of flip-flop FF1 and the setup time of FF2IN) corresponds to the shortest period of reference clock signal 120 which may drive synchronous circuit 100. Delaying FF2CLK by delay $\Delta_A$, provides the critical path with an additional time equal to delay $\Delta_A$ to resolve. The effect of this is that reference clock signal 120 may be increased in frequency. However, padding time to the critical path with delay circuit 110 is done at the expense of the next logic path through which FF2OUT must propagate. As such, inserting delay $\Delta_A$ into FF2CLK relative to reference clock signal 120 is a sort of "robbing Peter to pay Paul" activity. However, the effect of this time borrowing from one propagation path to the next can result in substantially higher global clock frequencies (e.g., reference clock signal 120) for an integrated circuit ("IC"), such as synchronous circuit 100, provided there is sufficient margin for logic coupled to the output side of flip-flop FF2.

Figure 3:
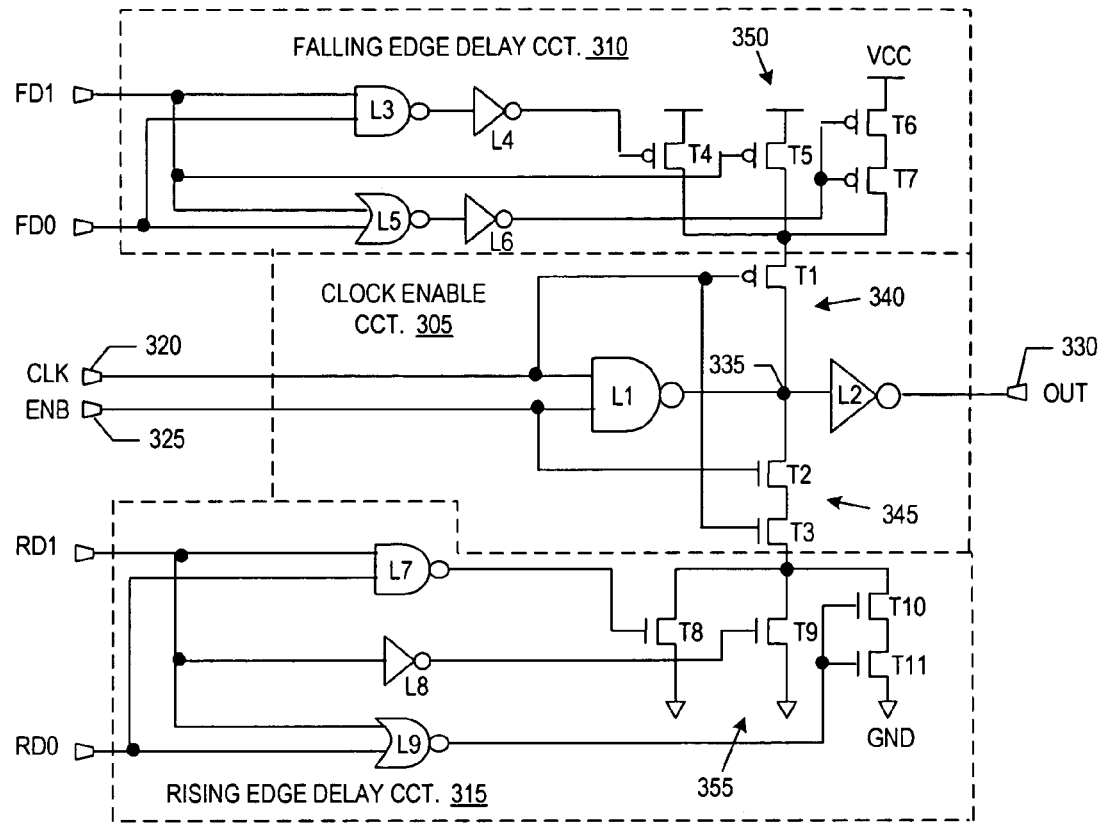
FIG. 3 is a circuit diagram illustrating a clock delay circuit, in accordance with an embodiment of the present invention.

FIG. 3 is a circuit schematic of a clock delay circuit 300, in accordance with an embodiment of the present invention. In one embodiment, clock delay circuit 300 can selectively insert one of four incremental clock delays via programmable delay settings. Furthermore, in one embodiment, clock delay circuit 300 can independently delay a rising edge or a falling edge of a reference clock signal. It should be appreciated that although clock delay circuit 300 is described in connection with delaying clock signals, that various other types of signals may be selectively delayed with clock delay circuit 300.

The illustrated embodiment of clock delay circuit 300 includes a clock enable circuit 305, a falling edge delay circuit 310, and a rising edge delay circuit 315. The illustrated embodiment of clock enable circuit 305 includes a clock input 320 for receiving reference clock signal 120 (hereinafter REF CLK 120), an enable input 325 to receive an enable signal, and an output 330 to output a delayed clock signal. The illustrated embodiment of falling edge delay circuit 310 includes two falling delay inputs FD0 and FD1 for selecting one of four falling delays to apply to the falling edge of REF CLK 120. The illustrated embodiment of rising edge delay circuit 315 includes two rising delay inputs RD0 and RD1 for selecting one of four rising delays to apply to the rising edge of REF CLK 120.

The components of clock enable circuit 305 are interconnected as follows. Clock input 320 and enable input 325 are coupled to the inputs of a NAND gate L1. The output of NAND gate L1 is coupled to a node 335. Node 335 is coupled to a pull up path 340, a pull down path 345, and an input of an inverter L2. The output of inverter L2 is coupled to output 330 for outputting the delayed clock signal. Pull up path 340 includes a P-type metal oxide semiconductor ("PMOS") transistor T1 having a drain coupled to node 335 and a source coupled to falling edge delay circuit 310. Pull down path 345 includes two N-type MOS ("NMOS") transistors T2 and T3 coupled in series between node 335 and rising edge delay circuit 315. The drain of transistor T2 is coupled to node 335 and the source of transistor T3 is coupled to falling edge delay circuit 315. Clock input 320 is further coupled to the gates of transistor T1 and T3 to turn transistor T1 on and transistor T3 off or transistor T1 off and transistor T3 on. Enable input 325 is further coupled to the gate of transistor T2. As can be seen from FIG. 3, when enable input 325 is logically low, transistor T2 is turned off and the output of NAND gate L1 will rise. Thus, when enable input 325 is a logic low or '0', the value of node 335 is a logic high or '1'. Having node 335 default to a high logic value enables quicker response for clock delay circuit 300, since NMOS transistors are more efficient than PMOS transistors and can pull node 335 down faster than PMOS transistor can pull node 335 up. Further, having node 335 rise when enable input 325 is logic low allows use of smaller P-type transistors thereby saving valuable IC real estate.

The components of falling edge delay circuit 310 are interconnected as follows. Falling edge delay circuit 310 includes a NAND gate L3, an inverter L4, a NOR gate L5, an inverter L6, and PMOS transistors T4–T7. Logic L3–L6 acts as a decoder of delay settings applied to inputs FD0 and FD1 to selectively turn on and off transistors T4–T7. Transistors T4–T7 are arranged into three parallel pull up paths 350 each coupled between a source voltage VCC and pull up path 340 of clock enable circuit 305. Logic L3–L6 along with inputs FD0 and FD1 are coupled to the gates of transistors T4–T7 to selectively turn on each of pull up paths 350. Increasing the number of pull up paths 350 conducting decreases the overall pull up resistance causing node 335 to rise quickly with less total fall delay through clock delay circuit 300. Correspondingly, decreasing the number of pull up paths 350 conducting increases the overall pull up resistance causing node 335 to rise slowly with more delay. It should be appreciated that the particular combinations of logic L3–L6 may be varied using more or less logic gates to obtain the same decoding results within the spirit of the present invention. Further, it should be appreciated that falling edge delay circuit 310 could be designed having more or less pull up paths 350 with corresponding decoder logic to support more or less falling delay inputs.

The components of rising edge delay circuit 315 are interconnected as follows. Rising edge delay circuit 315 includes a NAND gate L7, inverter L8, NOR gate L9, and NMOS transistors T8–T11. Logic L7–L9 acts as a decoder of delay settings applied to inputs RD0 and RD1 to selectively turn on and off transistors T8–T11. Transistors T8–T11 are arranged into three parallel pull down paths 355 each coupled between ground (or other low reference voltage) and pull down path 345 of clock enable circuit 305. Logic L7–L9 along with inputs RD0 and RD1 are coupled to the gates of transistors T8–T11 to selectively turn on each of pull down paths 355. Increasing the number of pull down paths 355 conducting to ground decreases the overall pull down resistance causing node 335 to fall quickly with less total rise delay through clock delay circuit 300. Similarly, decreasing the number of pull down paths 355 conducting increases the overall pull down resistance causing node 335 to fall slowly with more delay. It should be appreciated that the particular combinations of logic L7–L9 may be varied using more or less logic gates to obtain the same decoding results within the spirit of the present invention. Further, it should be appreciated that rising edge delay circuit 315 could be designed having more or less pull down paths 355 with corresponding decoder logic to support more or less rising delay inputs.

Figure 4:
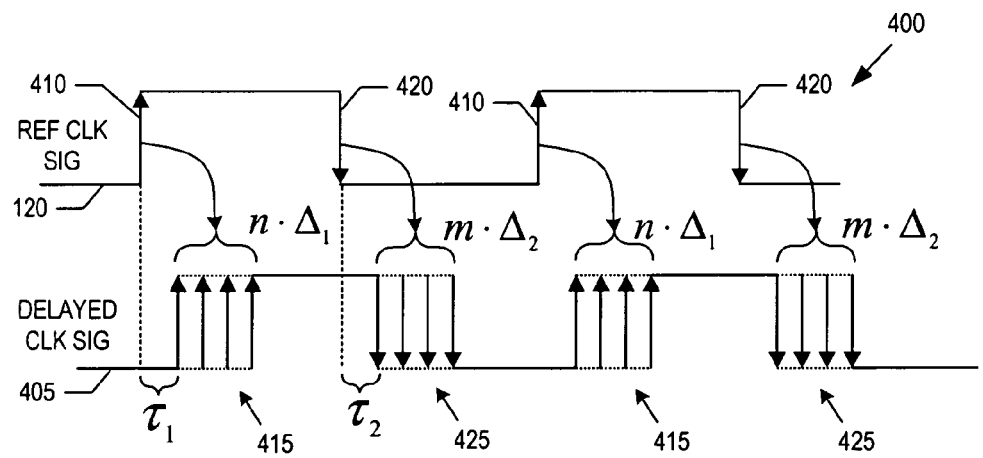
FIG. 4 is a timing diagram illustrating variable rising edge and falling edge delays of a clock delay circuit, in accordance with an embodiment of the present invention.

FIG. 4 illustrates a timing diagram 400 depicting variable rising edge and falling edge delays inserted by clock delay circuit 300, in accordance with an embodiment of the present invention. Timing diagram 400 includes a graphical representation of REF CLK 120 input into clock input 320 and a delayed clock signal 405 (hereinafter delayed CLK 405) generated at output 330. As illustrated, rising edges 410 of REF CLK 120 may be selectively delayed by one of four rising delays. Similarly, falling edges 420 of REF CLK 120 may be selectively delayed by one of four falling delays.

In one embodiment, rising edges 415 of delayed CLK 405 may be delayed in linear increments of $n \cdot \Delta_1$, where $n=0, 1, 2,$ or $3$ and $\Delta_1$ is a finite time delay. Thus, when [RD0,RD1] =[0,0], n=0, then rising edges 410 are delayed by a minimal amount $\tau_1$, which is equal to the time for REF CLK 120 to propagate through clock enable circuit 305 with all of pull down paths 355 conducting. When [RD0,RD1]=[0,1], n=1, then rising edges 410 are delayed by $\tau_1$, plus one $\Delta_1$ delay, and two of pull down paths 355 are conducting. When [RD0,RD1]=[1,0], n=2, then rising edges 410 are delayed by $\tau_1$, plus two $\Delta_1$ delays, and one of pull down paths 355 is conducting. When [RD0,RD1]=[1,1], n=3, then rising edges 410 are delayed by $\tau_1$, plus three $\Delta_1$ delays, and none of pull down paths 355 are conducting. By selecting the sizes of transistors T8–T11 the increments between each rising delay may be linear or even nonlinear. In one embodiment, clock delay circuit 300 may be designed such that one $\Delta_1$ delay is equal to 7 ps.

In one embodiment, falling edges 425 of delayed CLK 405 may be delayed in linear increments of $m \cdot \Delta_2$, where $m=0, 1, 2,$ or $3$ and $\Delta_2$ is a finite time delay. When [FD0,FD1]=[0,0], m=0, then falling edges 420 are delayed by the minimal amount T2, which is equal to the time for REF CLK 120 to propagate through clock enable circuit 305 with all of pull down paths 350 conducting. When [FD0,FD1]=[0,1], m=1, then falling edges 410 are delayed by $\tau_2$ plus one $\Delta_2$ delay, and two of pull up paths 350 are conducting. When [FD0,FD1]=[1,0], m=2, then falling edges 410 are delayed by $\tau_2$ plus two $\Delta_2$ delays, and one of pull up paths 350 is conducting. When [FD0,FD1]=[1,1], m=3, then falling edges 410 are delayed by $\tau_2$ plus three $\Delta_2$ delays, and none of pull up paths 350 are conducting.

As can be seen from FIGS. 3 and 4, clock delay circuit 300 can be programmed with different delay settings applied to each of falling delay inputs FD0 and FD1 and rising delay inputs RD0 and RD1. By selecting the sizes of transistors T4–T7 and T8–T11, the increments between each rising delay and each falling delay may be linear or nonlinear. Further it should be appreciated that the rising delays may be independently adjusted or selected from the falling delays. Adjusting the delays applied to rising edges 415 and falling edges 425 of delayed CLK 405 does not change the frequency of delayed CLK 405 from that of REF CLK 120. However, the duty cycle of delayed CLK 405 is altered when the rising edge and/or the falling edge delays are applied.

Figure 5:
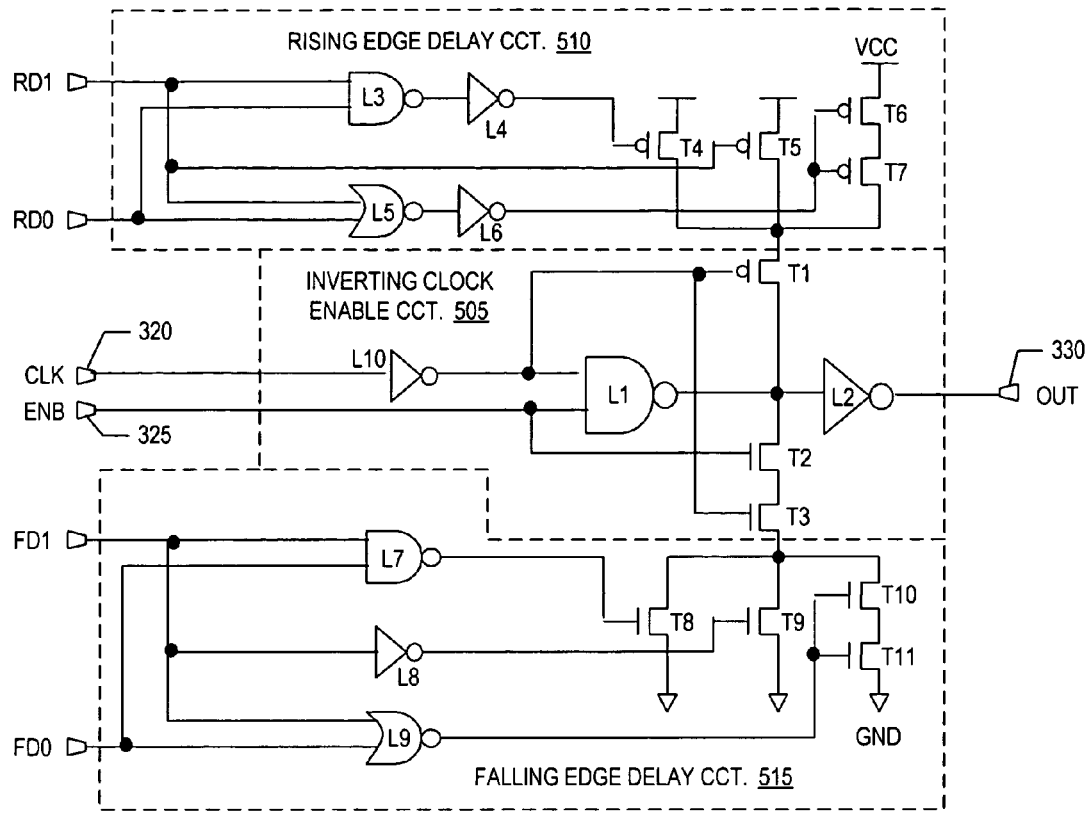
FIG. 5 is a circuit diagram illustrating an inverting clock delay circuit, in accordance with an embodiment of the present invention.

FIG. 5 is circuit schematic of an inverting clock delay circuit 500, in accordance with an embodiment of the present invention. Inverting clock delay circuit 500 operates in a is similar to clock delay circuit 300, except clock input 320 is logically inverted and inputs FD0, FD1 and RD0, RD1 are swapped. Like components are labeled with like references.

Inverting clock delay circuit 500 includes an inverting clock enable circuit 505, a rising edge delay circuit 510, and a falling edge delay circuit 515. Inverting clock enable circuit 505 differs from clock enable circuit 305 by the insertion of an inverter L10 between clock input 320 and NAND gate L1. Rising edge delay circuit 510 is similar to falling edge delay circuit 310, with the exception that the inputs RD0 and RD1 select rising delays, as opposed to falling delays. Falling edge delay circuit 515 is similar to rising edge delay circuit 315, with the exception that the inputs FD1 and FD0 select falling delays, as opposed to rising delays. Thus, the delay setting inputs RD0, RD1 and FD0, FD1 are reversed between clock delay circuit 300 and inverting clock delay circuit 500.

Figure 6:
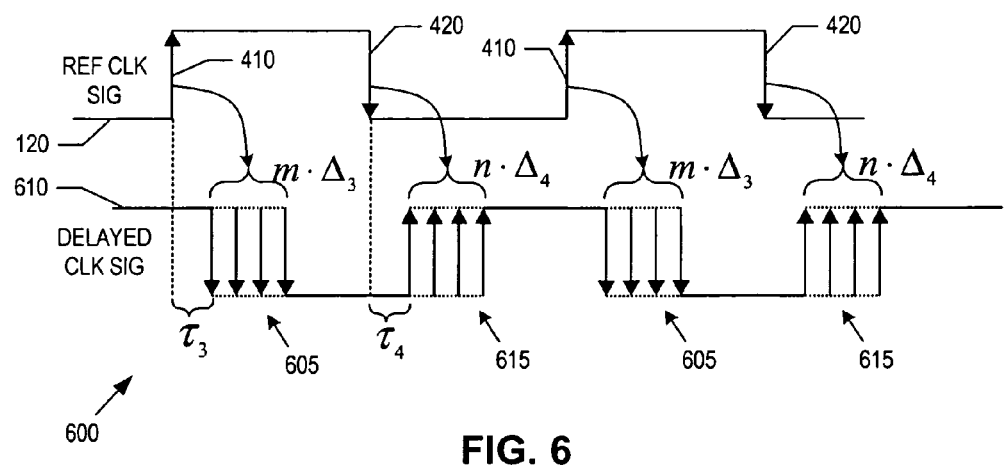
FIG. 6 is a timing diagram illustrating variable rising edge and falling edge delays of an inverting clock delay circuit, in accordance with an embodiment of the present invention.

FIG. 6 illustrates a timing diagram 600 depicting variable rising edge and falling edge delays inserted by inverting clock delay circuit 500, in accordance with an embodiment of the present invention. As can be seen from FIG. 6, rising edges 410 of REF CLK 120 are translated by inverting clock delay circuit 500 to falling edges 605 of delayed CLK 610. Falling edges 420 of REF CLK 120 are translated by inverting clock delay circuit 500 to rising edges 615 of delayed CLK 610.

Falling edges 605 may be selectively delayed according to delay settings applied to RD0 and RD1 of rising edge delay circuit 510. In one embodiment, falling edges 605 may be delayed by one of four incremental delays. In one embodiment, the incremental delays are linearly separated with increments of $n \cdot \Delta_3$, where $n=0, 1, 2,$ or $3$ and $\Delta_3$ is a finite time delay. When [RD0,RD1]=[0,0], n=0, then the falling edges of delayed clock signal 610 are delayed by the minimal amount $\tau_3$, which is equal to the time for REF CLK 120 to propagate through inverting clock enable circuit 505 with all of the pull up paths of rising edge delay circuit 510 conducting.

Rising edges 615 may be selectively delayed according to delay settings applied to FD0 and FD1 of falling edge delay circuit 515. In one embodiment, rising edges 615 may be delayed by one of four incremental delays. In one embodiment, the incremental delays are linearly separated with increments of $n \cdot \Delta_4$, where $n=0, 1, 2,$ or $3$ and $\Delta_4$ is a finite time delay. When [FD0,FD1]=[0,0], n=0, then the rising edges of delayed clock signal 610 are delayed by the minimal amount $\tau_4$, which is equal to the time for REF CLK 120 to propagate through inverting clock enable circuit 505 with all of pull down paths of falling edge delay circuit 515 conducting. It should be appreciated that delaying the falling edges 605 or rising edges 615 of delayed clock signal 610 does not cause the frequency of delayed CLK 610 to differ from the frequency of REF CLK 120, rather merely selectively delays its falling and/or rising edges therefrom. Further, it should be noted that the delays inserted into falling edges 605 are independent of the delays inserted into rising edges 615.

Figure 7:
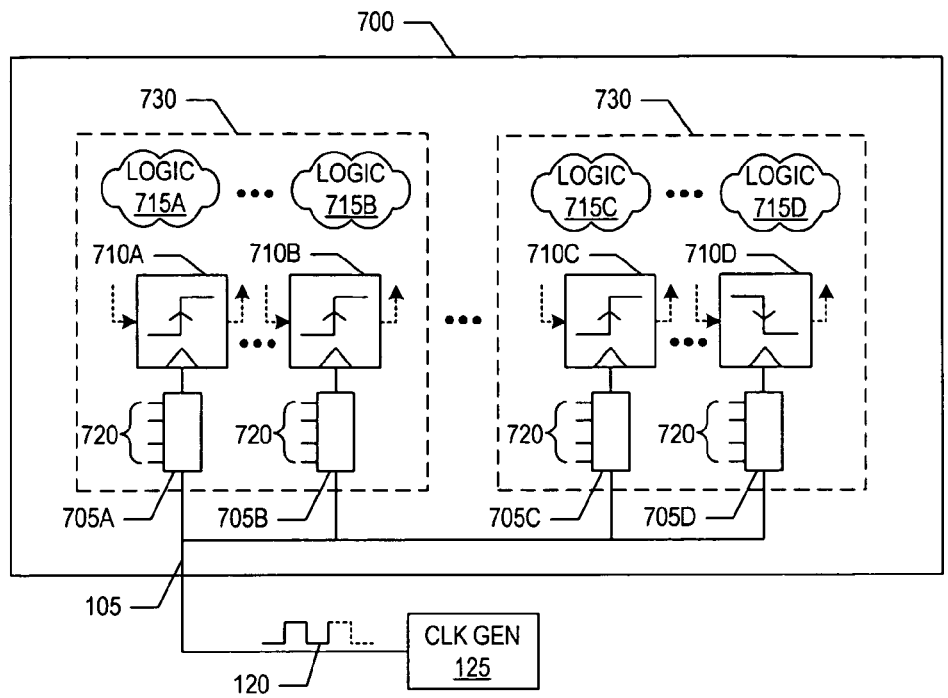
FIG. 7 illustrates an integrated circuit including clock delay circuits to selectively delay a reference clock by variable amount throughout the integrated circuit, in accordance with an embodiment of the present invention.

FIG. 7 illustrates an integrated circuit ("IC") 700 including delay circuits to selectively delay REF CLK 120 by variable amounts throughout IC 700, in accordance with an embodiment of the present invention. The illustrated embodiment of IC 700 includes delay circuits 705A–D (collectively 705), flip-flops 710A–D (collectively 710), and logic clusters 715A–D (collectively 715).

Delay circuits 705A–C clock rising edge flip-flops 710A–C and therefore may correspond to embodiments of clock delay circuit 300. Delay circuit 705D clocks a falling edge flip-flop 710D and therefore may correspond to embodiments of inverting clock delay circuit 500. One of ordinary skill in the art having the benefit of the instant disclosure will appreciate that other configuration combinations are also possible. For example, a falling edge flip-flop (e.g., flip-flip 710D) may be clocked off clock delay circuit 300, or conversely, a rising edge flip-flop (e.g., flip-flop 710A) may be clocked off inverting clock delay circuit 500.

Each of delay circuits 705 include a set of inputs 720, which correspond to [RD0,RD1] and [FD0,FD1]. When enable input 325 is asserted, flip-flops 710 each store data received from one of logic clusters 715 coupled to an input for one clock cycle and latch the data to an output for delivery to a next stage of logic clusters 715. Although clock delay circuit 300 and inverting clock delay circuit 500 both are illustrated with enable inputs 325, it should be appreciated that alternative embodiments of the present invention (e.g., clock delay circuit 300 and inverting clock delay circuit 500) need not include enable inputs. Rather, in these alternative embodiments, clock enable circuit 305 and inverting clock enable circuit 505 are always enabled.

Each of flip-flops 710 are clocked by a delayed version of REF CLK 120. In one embodiment, each of delay circuits 705 may be configured to delay its corresponding flip-flop 710 by a similar amount. In one embodiment, individual delay settings may be applied to each of delay circuits 705 to delay their corresponding flip-flop 710 by individually selected amounts. In yet another embodiment, IC 700 is divided into domains 730. In this alternative embodiment, the inputs 720 of each of delay circuits 705 residing within the same domain 730 are coupled together, such that the same delay settings are applied to all delay circuits 705 within a single one of domains 730. Grouping delay circuits 705 into domains 730 may be convenient for very large scale integrated circuits ("VLSIs"), which may include 18,000 delay circuits or more. Determining and applying individual delay settings to 18,000 delay circuits may be an unreasonably difficult design task requiring considerable circuit real estate devoted to routing conductor traces for inputs 720. For example, 18,000 delay circuits may be grouped into approximately 120 domains 730. It should be appreciated that embodiments of the present invention may include any number of delay circuits 705 grouped into any number of domains 730 for clocking flip-flops 710. It should further be appreciated that embodiments of the present invention may further be used to delay other types of latches and/or sampling circuits than just flip-flops 710.

Figure 8:
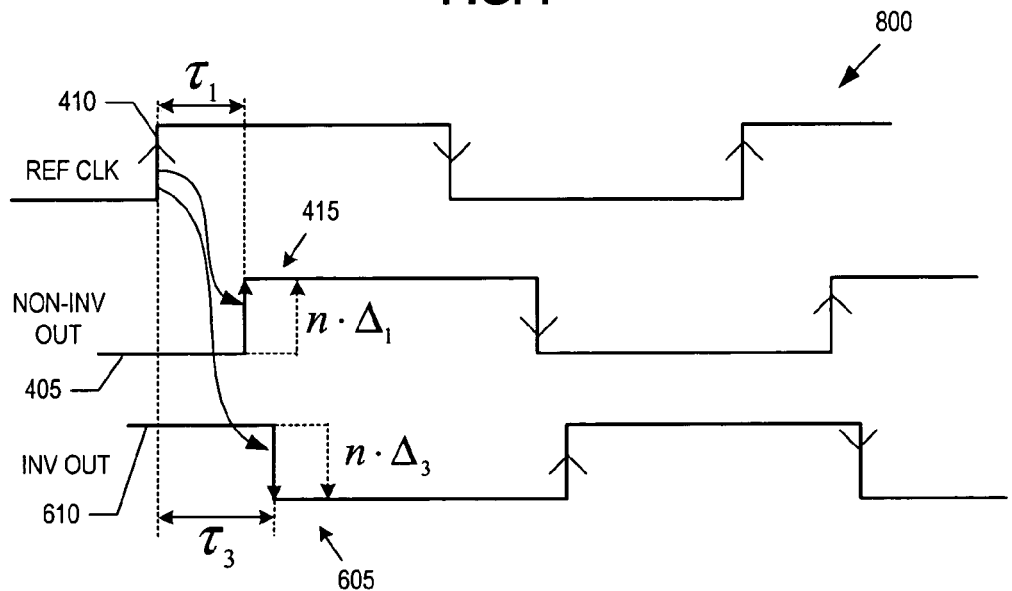
FIG. 8 is a timing diagram illustrating a rising edge delay of a reference clock using a non-inverting clock delay circuit and a falling edge delay of the reference clock using an inverting clock delay circuit, in accordance with an embodiment of the present invention.

FIG. 8 illustrates a timing diagram 800, in accordance with an embodiment of the present invention. Timing diagram 800 shows how rising edges of a delayed CLK 405 output by delay circuits 705A–C and a falling edges of delayed CLK 610 output by delay circuit 705D relate to a single rising edge 410 of REF CLK 120.

Delay circuits 705A–C delay REF CLK 120 without inverting. Rising edge 410 of REF CLK 120 results in a delayed rising edge 415 of delayed CLK 405. Rising edge 415 is delayed by $\tau_1 + n \cdot \Delta_1$ (where n=0, 1, 2, 3). Delay circuit 705D is configured to invert and delay REF CLK 120. Falling edge 605 is delayed by $\tau_3 + n \cdot \Delta_3$ (where n=0, 1, 2, 3). Typically, inverting clock delay circuits 500 will have a larger minimum delay $\tau_3$ due to the extra delay added by inverter L1. However, transistors T8–T11 of falling edge delay circuit 515 and transistors T2 and T3 of inverting clock enable circuit 505 (and T4–T7 of rising edge delay circuit 510 and transistor T1 of inverting clock enable circuit 505) may be designed to compensate for this extra delay. By swapping FD0, FD1 and RD0, RD1 between clock delay circuits 300 and 500, the same clock edge is impacted for both inverting and non-inverting delay circuits 705. Without swapping FD0, FD1 and RD0, RD1, a change in any delay settings applied to inputs 720 could result in a race path. For example, if a logic path begins with a non-inverting element (e.g., flip-flop 710C) and ends with an inverting element (e.g., flip-flop 710D), then changing delay settings applied to both of their inputs 720 will not cause frequency variations or race paths to appear.

Figure 9:
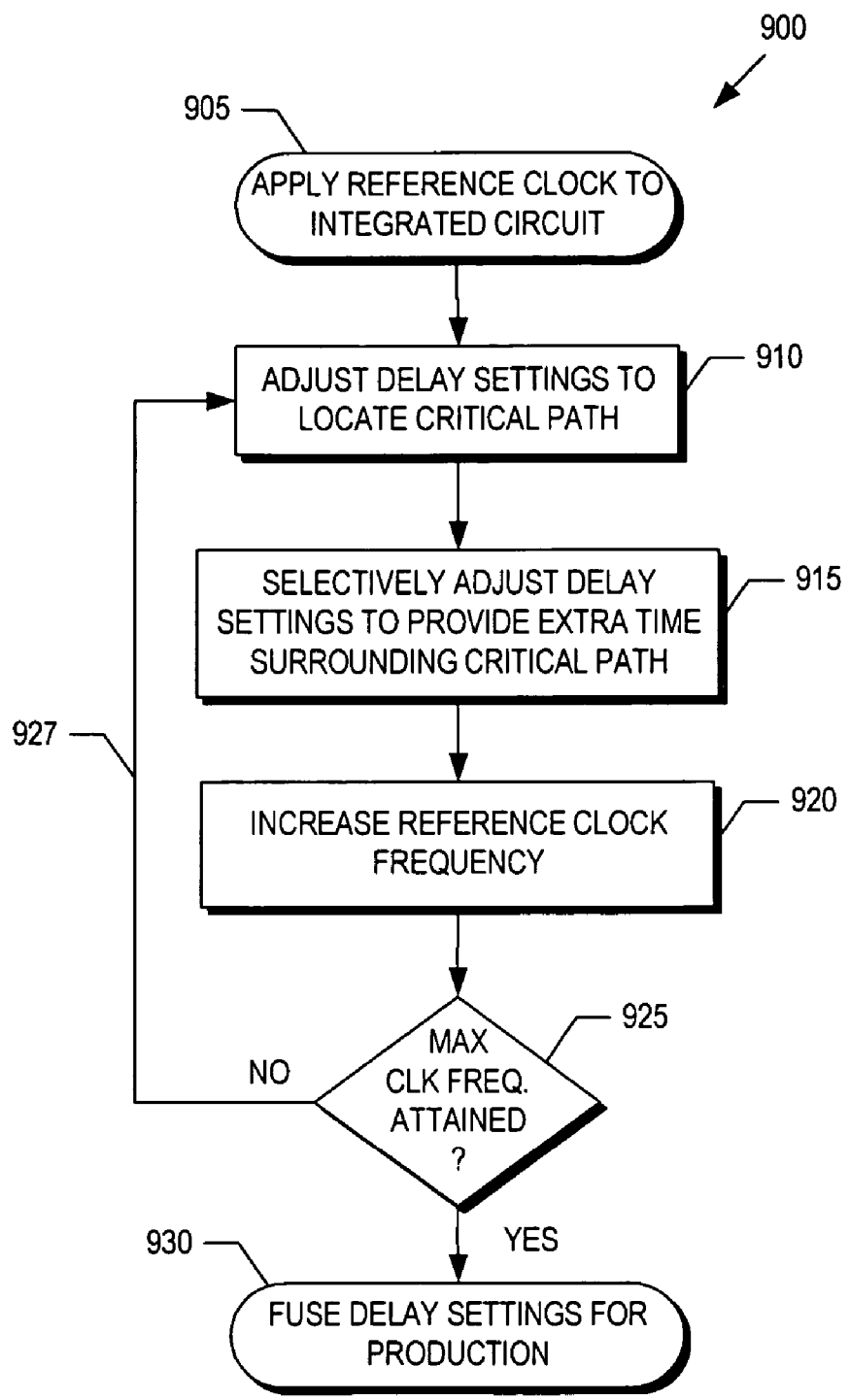
FIG. 9 is a flow chart illustrating a process to determine delay settings of clock delay circuits within an integrated circuit, in accordance with an embodiment of the present invention.

FIG. 9 is a flow chart illustrating a process 900 to determine delay settings to apply to delay circuits 705, in accordance with an embodiment of the present invention. In a process block 905, REF CLK 120 having an initial frequency is applied to IC 700. The initial frequency applied may be a frequency just beyond a fail point frequency of IC 700. In a process block 910, the delay settings applied to each of domains 730 are adjusted or "tweaked" to locate the one or more domains 730 that no longer cause IC 700 to fail at the initial failing frequency due to the adjustments applied to inputs 720. Individually tweaking each domain 730 to determine which domain is on the verge of failure can expedite locating the critical path. In one embodiment, the adjustments applied to inputs 720 may be applied in an ad hoc manner using educated guesses based on knowledge of the design of IC 700 and where the critical path of IC 700 is likely to reside. Alternatively, a systematic approach to tweaking each domain 730 may be taken.

Once the critical path has been located, the delay settings applied to delay circuits surrounding the critical path may be adjusted to provide extra time for the critical path (process block 915). Subsequently, the frequency of CLK REF 120 may be increased to leverage the additional time padded to either end of the critical path. Then, process 900 loops back to process block 910 where the delay settings applied to domains 730 are once again tweaked to locate the critical path of IC 700. If a new critical path is located then the delay settings may again be adjusted surround this new critical path (process block 915) and REF CLK 120 again increased to leverage the new settings (process block 920). Process 900 loops around many times, as indicated by arrow 927 until adjusting the delay settings applied to inputs 720 of delay circuits 705 can no longer increase the frequency of REF CLK 120. At this point, it is determined in a decision block 925 that the maximum frequency of REF CLK 120 has been attained. Once the maximum frequency is attained, the delay settings are fused (e.g., permanently set) into IC 700 as production tuning (process block 930). Tweaking the delay settings of delay circuits 705 can result in substantial increases in the frequency of REF CLK 120 (e.g., as much as 550 MHz or more).

Thus, embodiments of clock delay circuit 300 and inverting clock delay circuit 500 (i.e., delay circuits 705) enable independent rising edge and falling edge delay control.

Further, embodiments include multiple delay increments that increase either linearly or nonlinearly as desired. Delay circuits 705 are compact, consume relatively low internal power, and providing high gain. Delay circuits 705 may be used to debug a circuit design, find critical paths, and increase the overall clock speed of an IC by borrowing time from non-critical paths to alleviate a critical path. Once optimal delay settings for application to inputs 720 have been determined, these settings can be fused into the design during mass production/fabrication or during other similar techniques such as bond out or package option.

Figure 10:
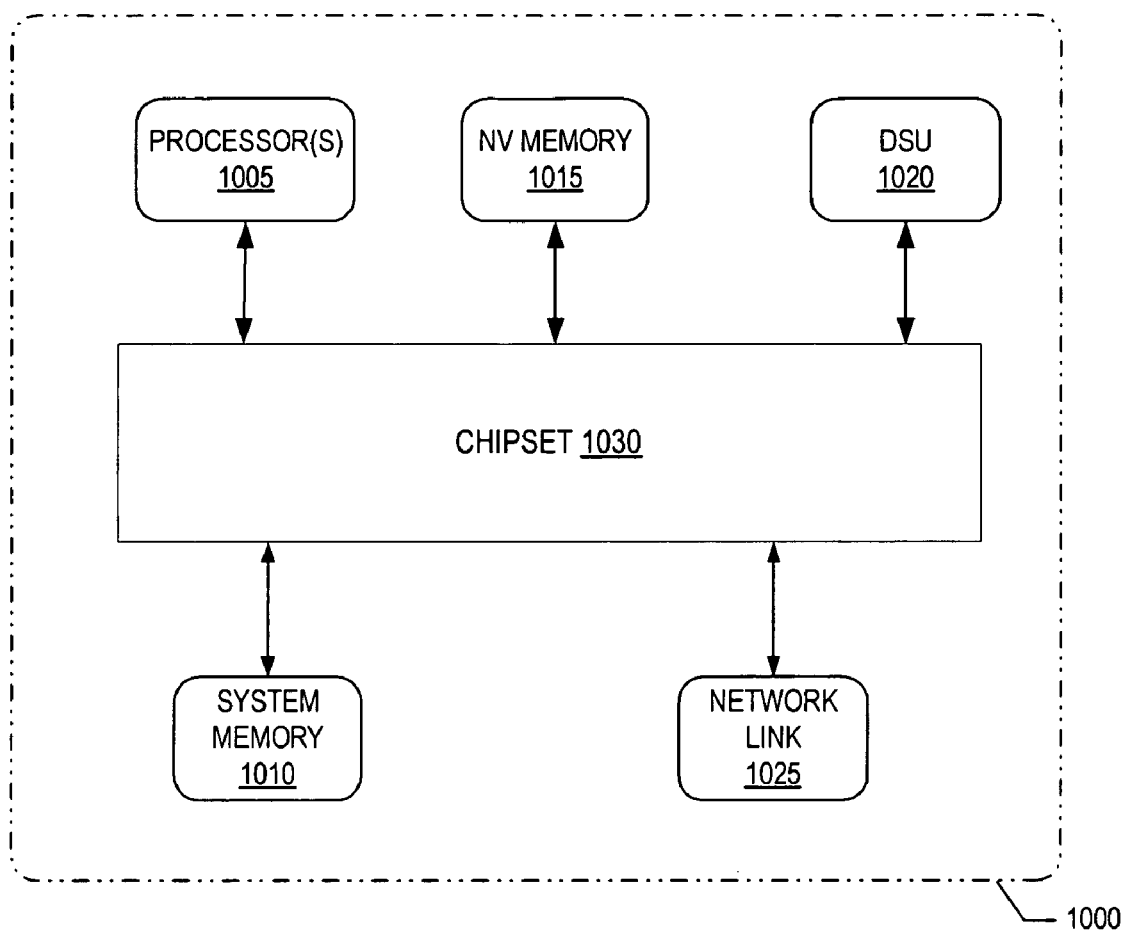
FIG. 10 is a block diagram illustrating a demonstrative processing system for implementing embodiments of the present invention.

FIG. 10 is a block diagram illustrating a demonstrative processing system 1000 for implementing embodiments of the present invention. The illustrated embodiment of processing system 1000 includes one or more processors (or central processing units) 1005, system memory 1010, nonvolatile ("NV") memory 1015, a data storage unit ("DSU") 1020, a network link 1025, and a chipset 1030. The illustrated processing system 1000 may represent any computing system including a desktop computer, a notebook computer, a workstation, a handheld computer, a server, a blade server, or the like.

The elements of processing system 1000 are interconnected as follows. Processor(s) 105 is communicatively coupled to system memory 1010, NV memory 1015, DSU 1020, and network link 1025, via chipset 1030 to send and to receive instructions or data thereto/therefrom. In one embodiment, NV memory 1015 is a flash memory device. In other embodiments, NV memory 1015 includes any one of read only memory ("ROM"), programmable ROM, erasable programmable ROM, electrically erasable programmable ROM, or the like. In one embodiment, system memory 1010 includes random access memory ("RAM"). DSU 1020 represents any storage device for software data, applications, and/or operating systems, but will most typically be a nonvolatile storage device. DSU 1020 may optionally include one or more of an integrated drive electronic ("IDE") hard disk, an enhanced IDE ("EIDE") hard disk, a redundant array of independent disks ("RAID"), a small computer system interface ("SCSI") hard disk, and the like. Although DSU 1020 is illustrated as internal to processing system 1000, DSU 1020 may be externally coupled to processing system 1000. Network link 1025 may couple processing system 1000 to a network such that processing system 1000 may communicate over the network with one or more other computers. Network link 1025 may include a modem, an Ethernet card, Universal Serial Bus ("USB") port, a wireless network interface card, or the like.

It should be appreciated that various other elements of processing system 1000 have been excluded from FIG. 10 and this discussion for the purposes of clarity. For example, processing system 1000 may further include a graphics card, additional DSUs, other persistent data storage devices (e.g., tape drive), and the like. Chipset 1030 may also include a system bus and various other data buses for interconnecting subcomponents, such as a memory controller hub and an input/output ("I/O") controller hub, as well as, include data buses (e.g., peripheral component interconnect bus) for connecting peripheral devices to chipset 1030. Correspondingly, processing system 1000 may operate without one or more of the elements illustrated. For example, processing system 1000 need not include network link 1025.

Delay buffers 705 may be incorporated into processor(s) 1005 or chipset 1030 to enable the functionality described herein and derive the benefits therefrom. Furthermore, descriptions of IC 700 may be generated, compiled, and/or tested on processing system 1000. For example, behavioral level code describing IC 700, or portions thereof, may be generated on processing system 1000 using a hardware descriptive language, such as VHDL or Verilog, and stored to a machine-accessible medium. Alternatively, processing system 1000 may be used to compile the behavioral level code into register transfer level ("RTL") code, a netlist, or even a circuit layout of IC 700. The behavioral level code, the RTL code, the netlist, and the circuit layout all represent various levels of abstraction to describe IC 700 including delay circuits 705.

Examples of machine-accessible mediums used to transport the description of IC 700 include DSU 1020 or other portable media such as a CD-ROM, a DVD, a floppy disk, flash memory, or the like. Alternatively, processing system 1000 may transmit the description of IC 700 out network link 1025 modulated onto a carrier wave and communicated across a network, such as a local area network, a wide area network, or the Internet.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A delay circuit, comprising:
  a first circuit including:
    a circuit input to receive a reference signal;
    a circuit output to output a delayed signal being a delayed response to the reference signal;
    a logic circuit including a logic input and a logic output, the logic input coupled to the circuit input to generate an inversion of the reference signal at the logic output;
    a pull up path coupled to the logic output; and
    a pull down path coupled to the logic output;
  a falling edge delay circuit coupled to the pull up path to control delay of a falling edge of the reference signal, wherein the pull up path includes a first transistor to selectively couple the logic output to the falling edge delay circuit; and
  a rising edge delay circuit coupled to the pull down path to control delay of a rising edge of the reference signal, wherein the pull down path includes second and third transistors coupled in series to selectively couple the logic output to the rising edge delay circuit.

2. The delay circuit of claim 1, wherein the first circuit comprises an enable circuit and wherein the logic circuit further includes an enable input to receive an enable signal for enabling the delay circuit.

3. The delay circuit of claim 2, wherein the circuit input comprises a clock input to receive a reference clock signal and the reference signal comprises the reference clock signal.

4. The delay circuit of claim 1, wherein gates of the first and third transistors are coupled to the logic input of the logic circuit.

5. The delay circuit of claim 2, wherein a gate of the second transistor is coupled to the enable input.

6. The delay circuit of claim 2, wherein the enable circuit further includes an inverter coupling the logic output to the circuit output and wherein, the logic circuit comprises a NAND logic gate including first and second NAND inputs and a NAND output, the first NAND input corresponding to the logic input, the second NAND input corresponding to the enable input, and the NAND output corresponding to the logic output.

7. The delay circuit of claim 6, wherein the falling edge delay circuit comprises three parallel pull up paths each including at least one transistor to be coupled between a supply voltage and the pull up path of the enable circuit, each one of the three parallel pull up paths responsive to the falling delay signals to select one of the variable falling delays.

8. The delay circuit of claim 6, wherein the rising edge delay circuit comprises three parallel pull down paths each including at least one transistor to be coupled between a ground voltage and the pull down path of the enable circuit, each one of the three parallel pull down paths responsive to the rising delay signals to select one of the variable rising delays.

9. The delay circuit of claim 2, wherein the falling edge delay circuit and the rising edge delay circuit are coupled to delay the falling edge and the rising edge independently of each other.

10. The delay circuit of claim 9, wherein the falling edge delay circuit is further coupled to selectively delay the falling edge of the reference signal by variable falling delays and wherein the rising edge delay circuit is further coupled to selectively delay the rising edge of the reference signal by variable rising delays.

11. The delay circuit of claim 10, wherein the falling edge delay circuit further comprises falling delay inputs to receive falling delay signals, the falling edge delay circuit to select one of the variable falling delays based on the falling delay signals and wherein the rising edge delay circuit further comprises rising delay inputs to receive rising delay signals, the rising edge delay circuit to select one of the variable rising delays based on the rising delay signals.

12. The delay circuit of claim 10, wherein the falling edge delay circuit is further coupled to selectively delay the falling edge of the reference signal by one of four falling delays in linear increments, and wherein the rising edge delay circuit is further coupled to selectively delay the rising edge of the reference signal by one of four rising delays in linear increments.

13. A delay circuit, comprising:
    an inverting enable circuit including:
        a circuit input to receive a reference signal;
        a circuit output to output a delayed signal being a delayed inversion of the reference signal;
        a logic circuit including a logic input and a logic output;
        a first inverter coupling the circuit input to the logic input;
        a pull up path coupled to the logic output;
        a pull down path coupled to the logic output; and
        an second inverter coupling the logic output to the circuit output; and
    a falling edge delay circuit coupled to the pull down path to control delay of a falling edge of the reference signal; and
    a rising edge delay circuit coupled to the pull up path to control delay of a rising edge of the reference signal.

14. The delay circuit of claim 13, wherein the logic circuit comprises a NAND logic gate including first and second NAND inputs and a NAND output, the first NAND input corresponding to the logic input, the second NAND input coupled to an enable input, and the NAND output corresponding to the logic output.

15. The delay circuit of claim 14, wherein:
    the rising edge delay circuit comprises three parallel pull up paths each including at least one transistor to be coupled between a supply voltage and the pull up path of the inverting enable circuit, each one of the three parallel pull up paths responsive to rising delay inputs of the rising edge delay circuit to select one of variable falling delays of the output delayed signal; and
    the falling edge delay circuit comprises three parallel pull down paths each including at least one transistor to be coupled between a ground voltage and the pull down path of the inverting enable circuit, each one of the three parallel pull down paths responsive to falling delay inputs of the falling edge delay circuit to select one of variable rising delays of the output delayed signal.

16. The delay circuit of claim 13, wherein the pull up path includes a first transistor to selectively coupled the logic output to the rising edge delay circuit and wherein the pull down path includes second and third transistors coupled in series to selectively coupled the falling edge delay circuit to the logic output.

17. The delay circuit of claim 16, wherein the gates of the first and third transistors are coupled to the logic input of the logic circuit and wherein a gate of the second transistor is coupled to an enable input.

18. A machine-accessible medium having contained thereon a description of an integrated circuit, the integrated circuit comprising:
    a clock enable circuit including:
        a clock input to receive a reference clock signal;
        an enable input;
        a circuit output to output a delayed clock signal being a delayed response to the reference clock signal;
        a NAND logic circuit having a first NAND input coupled to receive the reference clock signal, a second NAND input coupled to the enable input, and a NAND output; and
        an inverter circuit coupling the NAND output to the circuit output;
    a falling edge delay circuit coupled to the enable circuit to control delay of a falling edge of the reference clock signal; and
    a rising edge delay circuit coupled to the enable circuit to control delay of a rising edge of the reference clock signal.

19. The machine-accessible medium of claim 18, wherein the description comprises one of hardware behavioral code, register transfer level code, a netlist, and a circuit layout.

20. The machine-accessible medium of claim 18, wherein the clock enable circuit comprises an inverting clock enable circuit and wherein the inverting clock enable circuit further includes an inverter coupled between the clock input and the first NAND input.

21. The machine-accessible medium of claim 18, wherein the falling edge delay circuit and the rising edge delay circuit are coupled to delay the falling edge and the rising edge independently of each other.

22. The machine-accessible medium of claim 21, wherein the falling edge delay circuit is further coupled to selectively delay the falling edge of the reference clock signal by variable falling delays and wherein the rising edge delay circuit is further coupled to selectively delay the rising edge of the reference clock signal by variable rising delays.

23. The machine-accessible medium of claim 22, wherein the falling edge delay circuit is further coupled to selectively delay the falling edge of the reference clock signal by one of four falling delays in linear increments, and wherein the rising edge delay circuit is further coupled to selectively delay the rising edge of the reference clock signal by one of four rising delays in linear increments.

24. The machine-accessible medium of claim 22, wherein the falling edge delay circuit further comprises falling delay inputs to receive falling delay signals, the falling edge delay circuit to select one of the variable falling delays based on the falling delay signals and wherein the rising edge delay circuit further comprises rising delay inputs to receive rising delay signals, the rising edge delay circuit to select one of the variable rising delays based on the rising delay signals.

25. The machine-accessible medium of claim 24, wherein the clock enable circuit further comprises:
    a first pull up path including a first transistor to selectively couple the NAND output to the falling edge delay circuit; and
    a pull down path including second and third transistors coupled in series to selectively couple the NAND output to the rising edge delay circuit.

26. The machine-accessible medium of claim 25, wherein the falling edge delay circuit comprises three parallel pull up paths each responsive to the falling delay signals to select one of the variable falling delays, and wherein the rising edge delay circuit comprises three parallel pull down paths each responsive to the rising delay signals to select one of the variable rising delays.

27. An integrated circuit, comprising:
    a clock distribution network to distribute a reference clock signal throughout the integrated circuit;
    clock delay circuits each comprising:
        a clock enable circuit including:
            a clock input to receive the reference clock signal;
            an enable input;
            a circuit output to output a delayed clock signal being a delayed response to the reference clock signal;
            a NAND logic circuit having a first NAND input coupled to receive the reference clock signal, a second NAND input coupled to the enable input, and a NAND output; and
            an inverter circuit coupling the NAND output to the circuit output;
        a falling edge delay circuit coupled to the enable circuit to control delay of a falling edge of the reference clock signal; and
        a rising edge delay circuit coupled to the enable circuit to control delay of a rising edge of the reference clock signal;
    latches each clocked according to the delayed clock signal output from each of the clock delay circuits; and
    logic clusters to compute logic values, the latches coupled to buffer the logic values between clock edges of the delayed clock signals.

28. The integrated circuit of claim 27, wherein the integrated circuit comprises a microprocessor.

29. The integrated circuit of claim 27, wherein the logic clusters comprise at least one of combinational logic and sequential logic.

30. The integrated circuit of claim 27, wherein the latches comprise flip-flops.

31. The integrated circuit of claim 27, wherein the falling edge delay circuit and the rising edge delay circuit are coupled to delay the falling edge and the rising edge independently of each other.

32. The integrated circuit of claim 31, wherein the clock enable circuit comprises:
    a first pull up path including a first transistor to selectively couple the NAND output to the falling edge delay circuit; and
    a pull down path including second and third transistors coupled in series to selectively couple the NAND output to the rising edge delay circuit.

33. The integrated circuit of claim 32, wherein the falling edge delay circuit comprises three parallel pull up paths each responsive to the falling delay signals to select one of the variable falling delays, and wherein the rising edge delay circuit comprises three parallel pull down paths each responsive to the rising delay signals to select one of the variable rising delays.

34. The integrated circuit of claim 27, wherein the falling edge delay circuit further comprises falling delay inputs to receive falling delay signals, the falling edge delay circuit to selectively delay the falling edge of the reference clock signal by one of variable falling delays based on the falling delay signals, and wherein the rising edge delay circuit further comprises rising delay inputs to receive rising delay signals, the rising edge delay circuit to selectively delay the rising edge of the reference clock signal by one of the variable rising delays based on the rising delay signals.

35. The integrated circuit of claim 34, wherein the clock delay circuits are grouped into domains of the integrated circuit, the falling delay inputs and the rising delay inputs of the clock delay circuits coupled to receive the same falling delay signals and the same rising delay signals within each of the domains.

36. The integrated circuit of claim 34, wherein the falling edge delay circuit is further coupled to selectively delay the falling edge of the reference clock signal by one of four falling delays in first increments, and wherein the rising edge delay circuit is further coupled to selectively delay the rising edge of the reference clock signal by one of four rising delays in second increments.

37. The integrated circuit of claim 36, wherein the first and second increments comprise substantially linear increments.

* * * * *